(12) United States Patent
Watanabe et al.

(10) Patent No.: US 11,280,831 B2
(45) Date of Patent: Mar. 22, 2022

(54) SEMICONDUCTOR INTEGRATED CIRCUIT WITH SELF TESTING AND METHOD OF TESTING

(71) Applicants: Kabushiki Kaisha Toshiba, Tokyo (JP); Toshiba Electronic Devices & Storage Corporation, Tokyo (JP)

(72) Inventors: Yuki Watanabe, Funabashi Chiba (JP); Masato Nakazato, Kawasaki Kanagawa (JP); Shohei Morishima, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 22 days.

(21) Appl. No.: 16/800,288

(22) Filed: Feb. 25, 2020

(65) Prior Publication Data

US 2021/0063484 A1 Mar. 4, 2021

(30) Foreign Application Priority Data

Sep. 2, 2019 (JP) .............................. JP2019-159662

(51) Int. Cl.
*G01R 31/3177* (2006.01)
*G01R 31/317* (2006.01)
(Continued)

(52) U.S. Cl.
CPC ... *G01R 31/3177* (2013.01); *G01R 31/31703* (2013.01); *G01R 31/31724* (2013.01);
(Continued)

(58) Field of Classification Search
CPC ........ G01R 31/3177; G01R 31/318547; G01R 31/318566; G01R 31/31724; G01R 31/31703; G06F 11/263
See application file for complete search history.

(56) References Cited

U.S. PATENT DOCUMENTS

| | | | |
|---|---|---|---|
| 7,013,414 B2 * | 3/2006 | Takeshige | G11C 29/40 365/201 |
| 7,353,440 B2 | 4/2008 | Ohwada et al. | |

(Continued)

FOREIGN PATENT DOCUMENTS

| | | |
|---|---|---|
| JP | 2003-234409 A | 8/2003 |
| JP | 2005-309867 A | 11/2005 |

(Continued)

OTHER PUBLICATIONS

G. Mrugalski, N. Mukherjee, J. Rajski, D. Czyszand J. Tyszer, "Compression based on deterministic vector clustering of incompatible test cubes," 2009 International Test Conference, Austin, TX, USA, 2009, pp. 1-10. (Year: 2009).*

(Continued)

*Primary Examiner* — Cynthia Britt
(74) *Attorney, Agent, or Firm* — Allen & Overy LLP

(57) ABSTRACT

According to one embodiment, a semiconductor integrated circuit includes: a first core that includes a first logic circuit that has a plurality of first scan chains, and a first generator that generates a first test pattern; a second core that includes a second logic circuit that has a plurality of second scan chains, and a second generator that generates a second test pattern; a controller that controls a test operation of the first and second cores. The controller is configured to: obtain a seed for a test pattern from the first generator; supply the obtained seed to the second generator; perform a test on the first and second cores for a same number of cycles; obtain (Continued)

first and second test results respectively from the first and second cores; and compare the first and second test results.

19 Claims, 13 Drawing Sheets

(51) Int. Cl.
*G01R 31/3185* (2006.01)
*G06F 11/263* (2006.01)

(52) U.S. Cl.
CPC ............... G01R 31/318547 (2013.01); G01R 31/318566 (2013.01); G06F 11/263 (2013.01)

(56) References Cited

U.S. PATENT DOCUMENTS

| | | | |
|---|---|---|---|
| 7,685,487 B1 | 3/2010 | Kuo et al. | |
| 8,856,602 B2 | 10/2014 | Brown et al. | |
| 10,746,790 B1* | 8/2020 | Cook Lobo | G01R 31/31724 |
| 2002/0138801 A1* | 9/2002 | Wang | G01R 31/31705 |
| | | | 714/729 |
| 2004/0003329 A1* | 1/2004 | Cote | G01R 31/318563 |
| | | | 714/726 |
| 2005/0060626 A1* | 3/2005 | Rajski | G06F 11/2221 |
| | | | 714/728 |
| 2005/0097413 A1* | 5/2005 | Ravi | G06F 11/263 |
| | | | 714/724 |
| 2006/0107154 A1* | 5/2006 | Bansal | G01R 31/31716 |
| | | | 714/738 |
| 2007/0214398 A1* | 9/2007 | Zhang | G01R 31/318371 |
| | | | 714/728 |
| 2008/0276144 A1* | 11/2008 | Huben | G01R 31/318385 |
| | | | 714/733 |

FOREIGN PATENT DOCUMENTS

| | | |
|---|---|---|
| JP | 4869911 B2 | 2/2012 |
| JP | 2015-509183 A | 3/2015 |
| JP | 5723515 B2 | 5/2015 |

OTHER PUBLICATIONS

D. Czysz, G. Mrugalski, N. Mukherjee, J. Rajski, P. Szczerbicki and J. Tyszer, "Deterministic Clustering of Incompatible Test Cubes for Higher Power-Aware EDT Compression," in IEEE Transactions on Computer-Aided Design of Integrated Circuits and Systems, vol. 30, No. 8, pp. 1225-1238, Aug. 2011. (Year: 2011).*

* cited by examiner

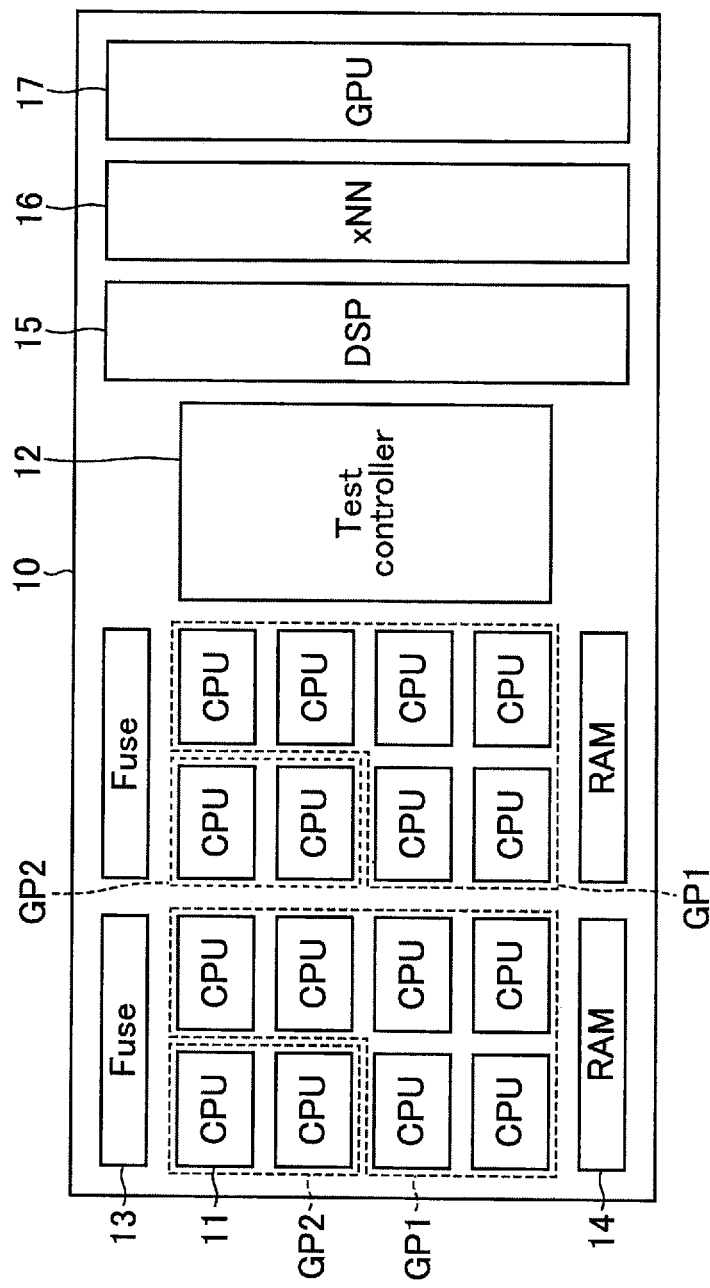
F I G. 1

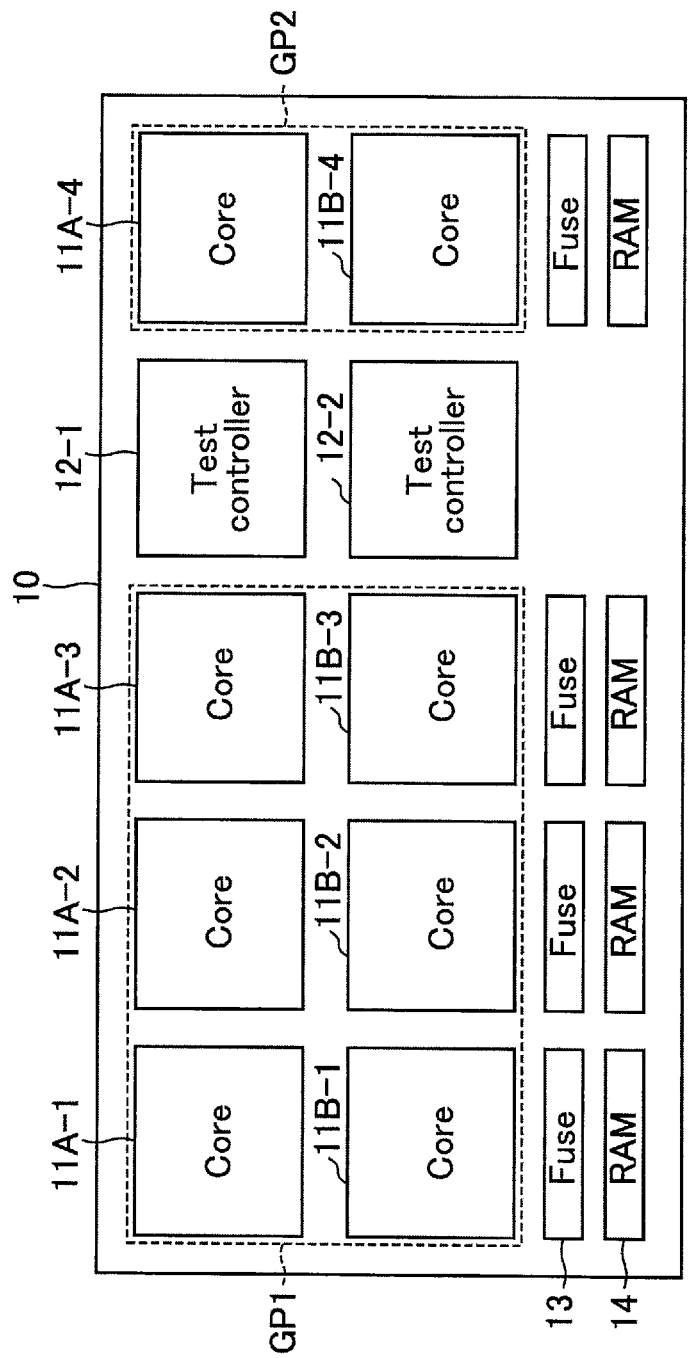
F I G. 2

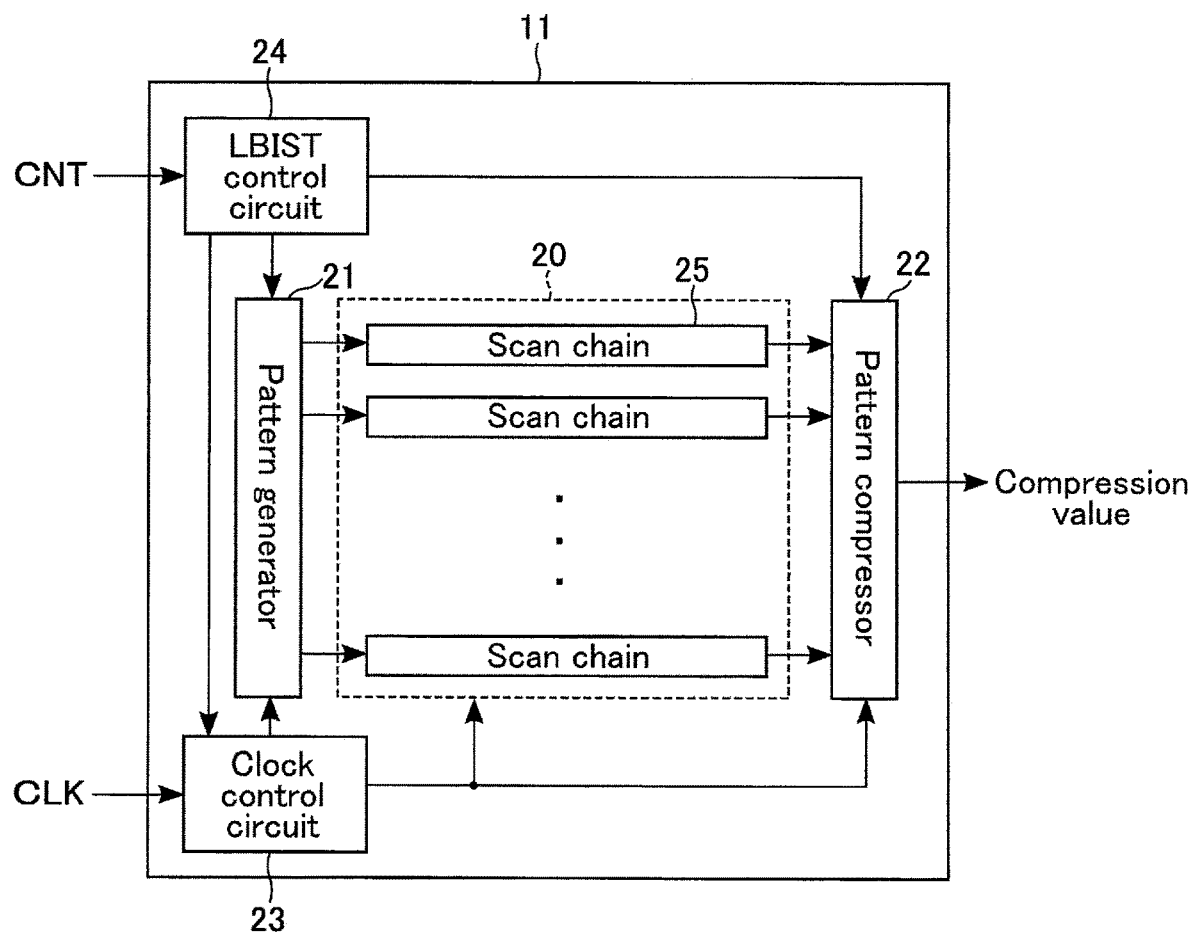
F I G. 3

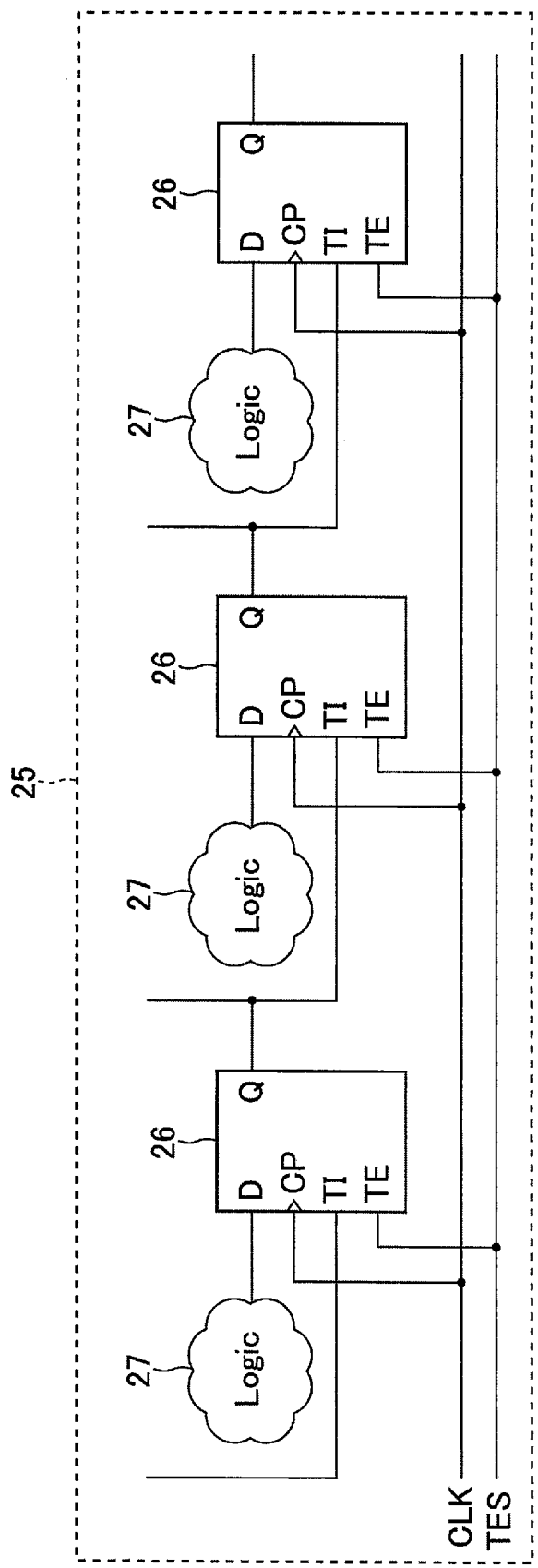
F I G. 4

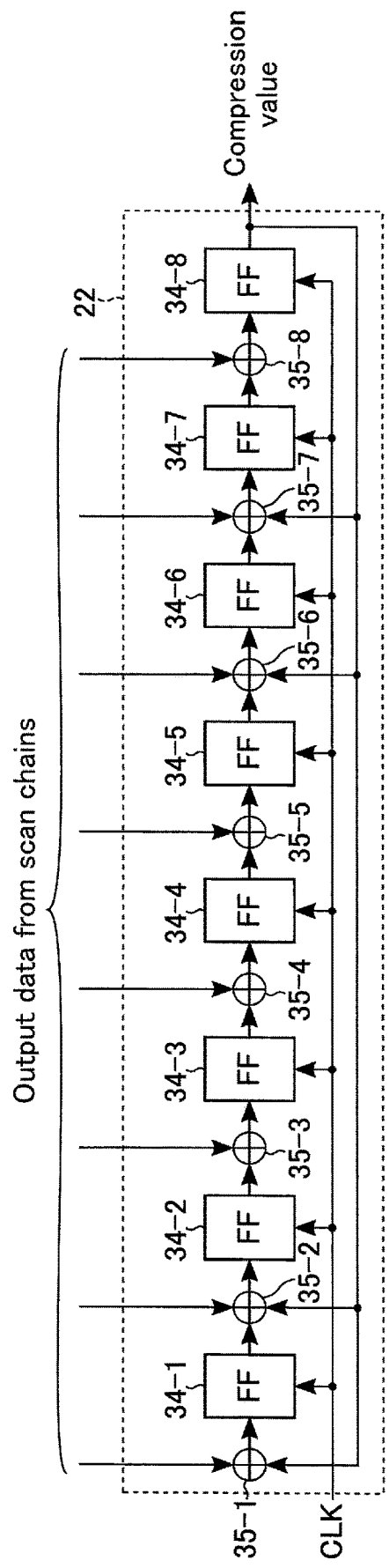
F I G. 8

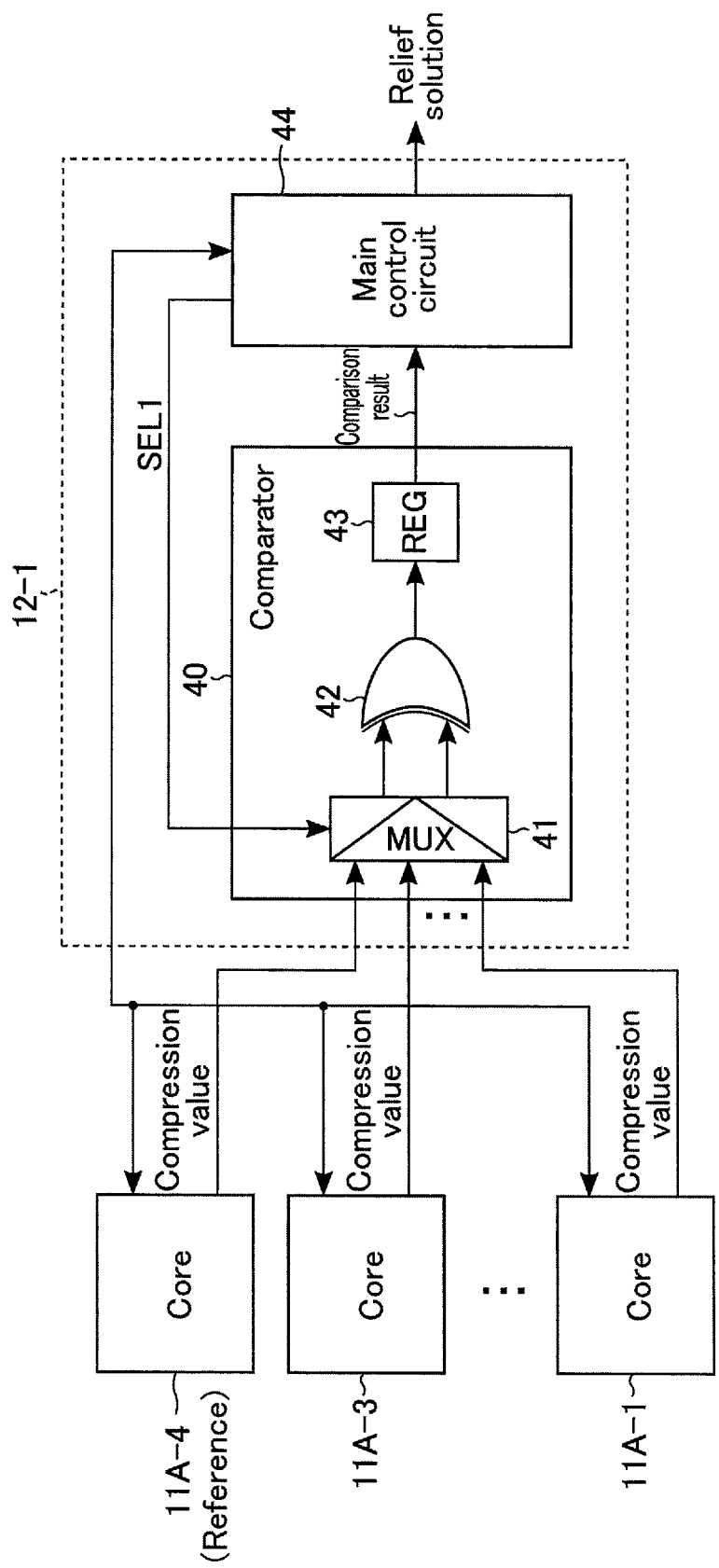
F I G. 9

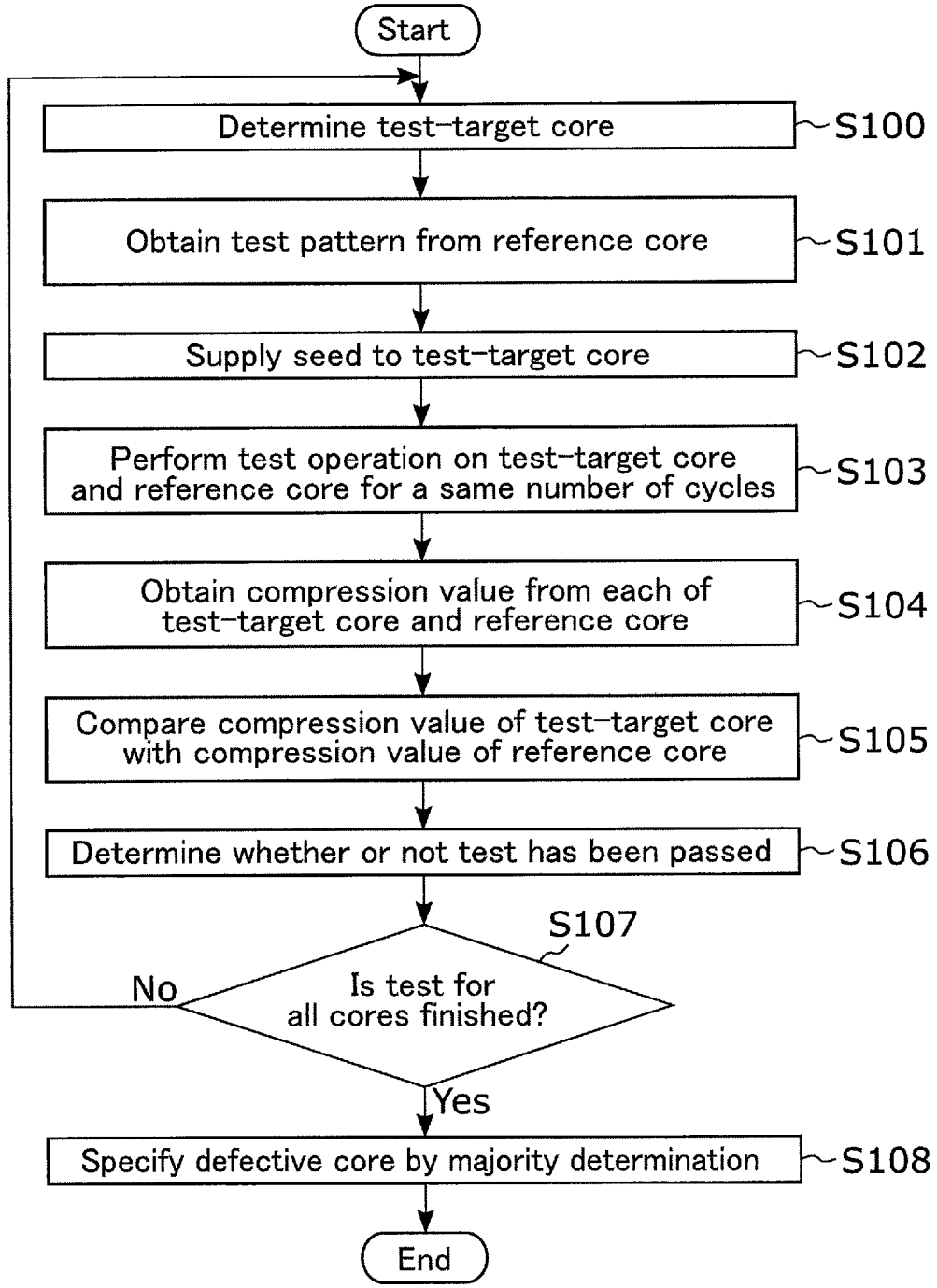
F I G. 10

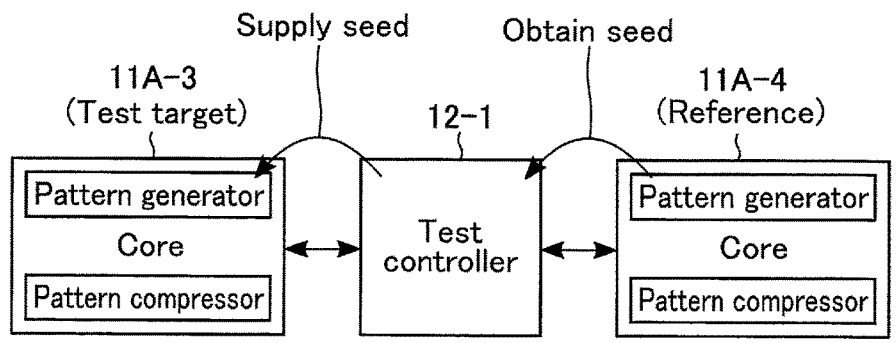
F I G. 11
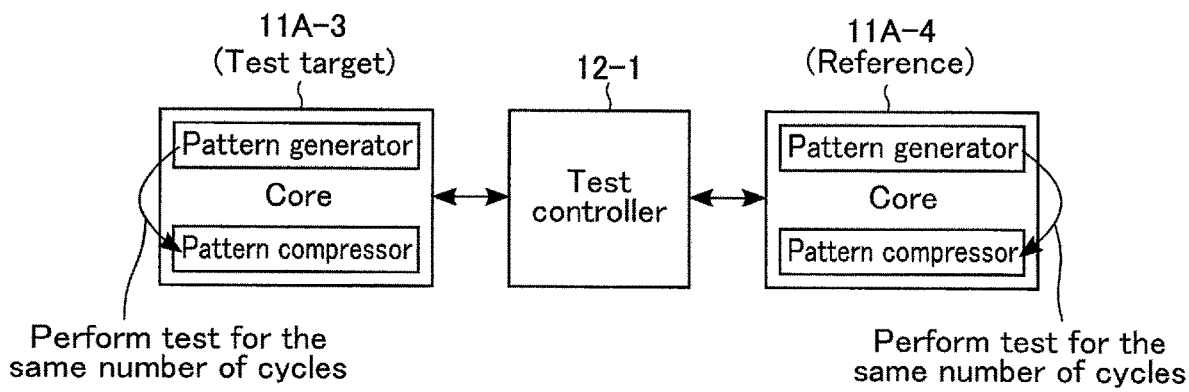
F I G. 12
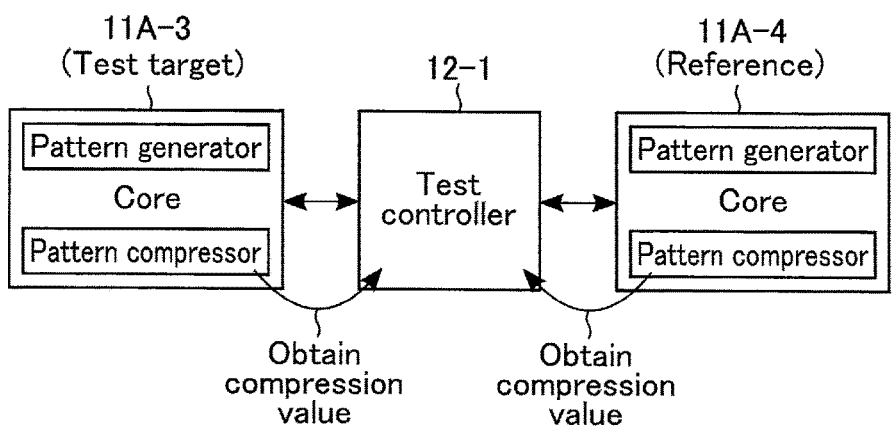
F I G. 13

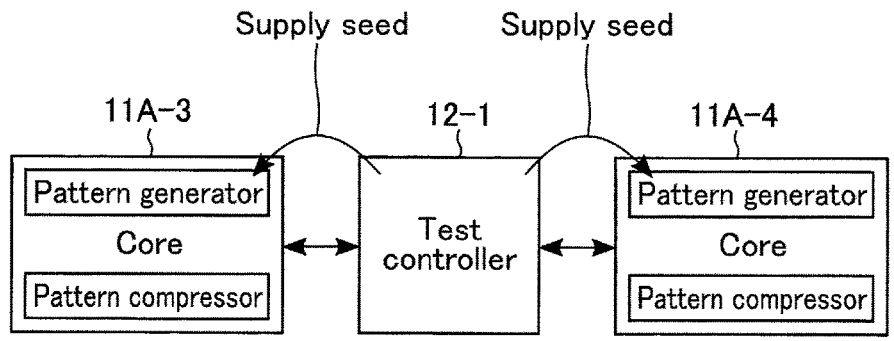
F I G. 16
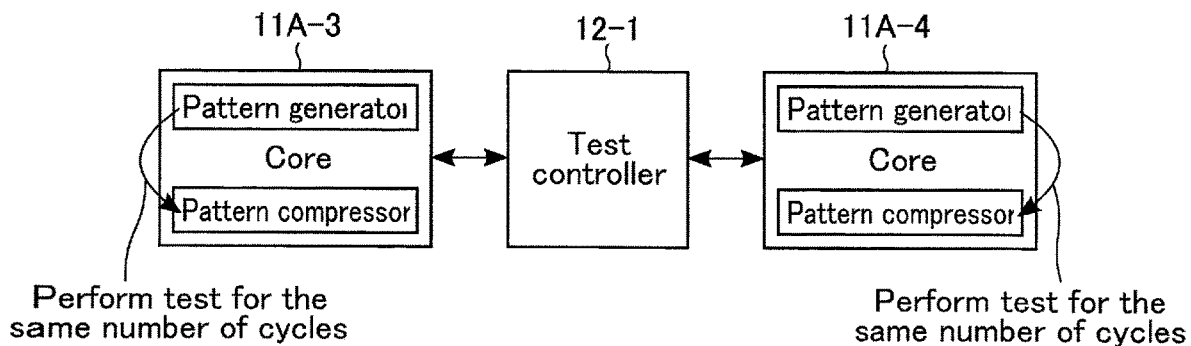
F I G. 17
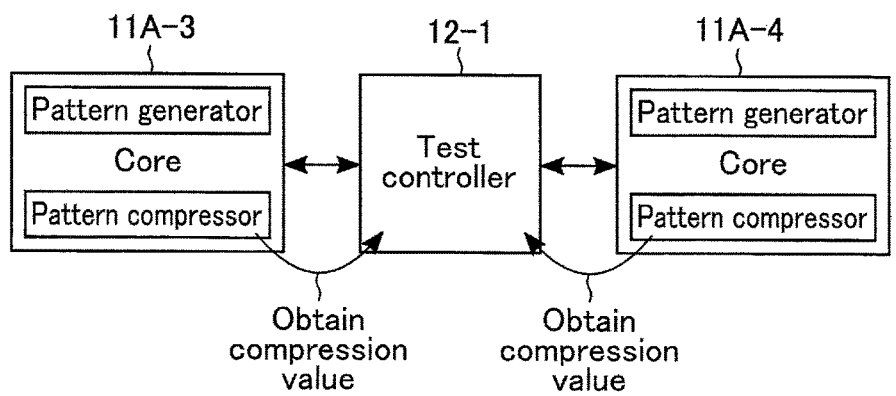
F I G. 18

SEMICONDUCTOR INTEGRATED CIRCUIT WITH SELF TESTING AND METHOD OF TESTING

CROSS-REFERENCE TO RELATED APPLICATIONS

This application is based upon and claims the benefit of priority from Japanese Patent Application No. 2019-159662, filed Sep. 2, 2019, the entire contents of which are incorporated herein by reference.

FIELD

Embodiments described herein relate generally to a semiconductor integrated circuit and a method of testing a semiconductor integrated circuit.

BACKGROUND

As techniques for solving difficulties in testing large-scale, complicated semiconductor integrated circuits, logic built-in self-testing (logic BIST, or LBIST) for a logic circuit is known. It is possible to use the logic BIST not only for an initial diagnosis at the time of manufacturing semiconductor integrated circuits but also for a continuous diagnosis during an operation of semiconductor integrated circuits.

In logic BIST, a test pattern is generated and input to a logic circuit. A testing result output from the logic circuit is then compressed, and the compression value is analyzed. In logic BIST, these operations are automatically performed within a semiconductor integrated circuit.

In a semiconductor integrated circuit for which high reliability is requested for the purpose of automatic driving, etc., a field test is conducted on a client system side after product shipment, and logic BIST is used as one of the field test methods. In a field test, it is desired to improve a failure detection rate.

BRIEF DESCRIPTION OF THE DRAWINGS

FIG. 1 is a block diagram explaining an example of a semiconductor integrated circuit according to a first embodiment.

FIG. 2 is a detailed block diagram of a main part of the semiconductor integrated circuit according to the first embodiment.

FIG. 3 is a block diagram of a core.

FIG. 4 is a circuit diagram of a part of a scan chain.

FIG. 8 is a circuit diagram explaining an example of a pattern compressor.

FIG. 9 is a block diagram of a test controller.

FIG. 10 is a flowchart explaining a test operation of the semiconductor integrated circuit according to the first embodiment.

FIG. 11 is a schematic diagram explaining a test operation.

FIG. 12 is a schematic diagram explaining a test operation.

FIG. 13 is a schematic diagram explaining a test operation.

FIG. 16 is a schematic diagram explaining a test operation.

FIG. 17 is a schematic diagram explaining a test operation.

FIG. 18 is a schematic diagram explaining a test operation.

DETAILED DESCRIPTION

Figure 5:
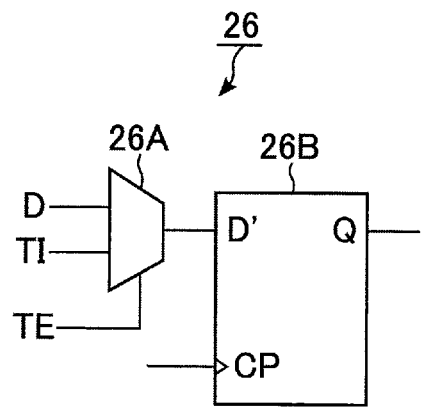
FIG. 5 is a circuit diagram showing another structure of a scan flip-flop.

In general, according to one embodiment, there is provided a semiconductor integrated circuit comprising:

a first core that includes a first logic circuit that has a plurality of first scan chains, and a first generator that generates a first test pattern for the plurality of first scan chains;

a second core that includes a second logic circuit that has a plurality of second scan chains, and a second generator that generates a second test pattern for the plurality of second scan chains;

a controller that controls a test operation of the first and second cores, wherein the controller is configured to:

obtain a seed for a test pattern from the first generator;

supply the obtained seed to the second generator;

perform a test on the first and second cores for a same number of cycles;

obtain first and second test results respectively from the first and second cores; and compare the first and second test results.

Hereinafter, embodiments will be described with reference to the accompanying drawings. The following embodiments are to present an example of a device and a method for carrying out the technical concept of the present invention, and it is to be understood that the technical concept of the present invention is not specified by the shapes, the structures, the arrangements, and the like of the constituent components. Each of the function blocks can be implemented in the form of hardware, software, or a combination thereof. The function blocks do not have to be categorized as in the example described below. For example, some of the functions may be implemented by a function block other than the exemplary function blocks. In addition, the exemplary function blocks may be further divided into function sub-blocks. In the description below, structural elements having substantially the same functions and configurations will be denoted by the same reference symbols, and a duplicate description of such elements will be given only where necessary.

If there is a need to distinguish constituent elements having the same reference numerals, additional symbols are appended to the reference numerals. If no distinction is necessary, the constituent elements are referred to by the same reference numerals only, and no additional symbols are appended.

[1] First Embodiment

[1-1] Structure of Semiconductor Integrated Circuit

FIG. 1 is a block diagram explaining an example of a semiconductor integrated circuit 10 according to the first embodiment. FIG. 1 is a structure example of a semiconductor integrated circuit 10 in which a multi-core structure is implemented.

The semiconductor integrated circuit 10 has a plurality of cores as blocks to be tested. The semiconductor integrated circuit 10 has a logic built-in self-testing (LBIST) circuit as will be described later. FIG. 1 shows an example where blocks to be tested are a plurality of processors (central processing units; CPUs).

The semiconductor integrated circuit 10 has a plurality of CPUs 11, a test controller 12, a plurality of fuse ROMs (read-only memory) 13, a plurality of RAMs (random access memory) 14, a digital signal processor (DSP) 15, a neural network circuit (xNN) 16, and a graphics processing unit (GPU) 17.

Each of the plurality of CPUs 11 is a block to be tested, and has an LBIST circuit.

The test controller 12 controls a test operation of the CPUs 11.

The fuse ROMs 13, the RAMs 14, the DSP 15, the neutral network circuit 16, and the GPU 17 are examples of circuits other than the blocks to be tested.

In the present embodiment, some of the CPUs 11 (which will be referred to as "group GP1") are used as a system, and some of the other CPUs (which will be referred to as "group GP2") are used as reference. The group GP1 used as a system is a test target. Using a group of CPUs as reference means using it as an operation to generate reference data in a test operation. Using a group of CPUs as system means using it as an operation to realize the functions of the semiconductor integrated circuit 10 itself.

FIG. 2 is a detailed block diagram of a main part of the semiconductor integrated circuit 10 according to the first embodiment. The semiconductor integrated circuit 10 has a plurality of cores 11A, a plurality of cores 11B, two test controllers 12-1 and 12-2, a plurality of fuse ROMs 13, and a plurality of RAMs 14. In the present embodiment, each block to be tested having the same circuit structure will be called a core. The cores shown in FIG. 2 correspond to the CPUs shown in FIG. 1.

In FIG. 2, four cores 11A-1 through 11A-4 and four cores 11B-1 and 11B-4 are shown as an example. The test controller 12-1 performs a test operation on the cores 11A-1 through 11A-4. The test controller 12-2 performs a test operation on the cores 11B-1 through 11B-4.

The cores 11A-1 through 11A-3 and the cores 11B-1 through 11B-3 included in the group GP1 are used as a system. The cores 11A-4 and 11B-4 included in the group GP2 are used as reference.

The fuse ROMs 13 and the RAMs 14 are examples of circuits other than the blocks to be tested.

[1-1-1] Structure of Core 11

Next, a structure of the core 11 will be described. FIG. 3 is a block diagram of the core 11. The core 11 includes a logic circuit 20, a pattern generator 21, a pattern compressor 22, a clock control circuit 23, and an LBIST control circuit 24.

The logic circuit 20 is a circuit that realizes a system operation of the core 11 and also a test-target circuit. The logic circuit 20 includes a plurality of scan chains 25. The structure of the scan chains 25 will be described later.

The pattern generator 21 generates a plurality of test patterns. A single test pattern is input in parallel to the plurality of scan chains 25. A plurality of test patterns are input per cycle and sequentially to the plurality of scan chains 25. The pattern generator 21 is, for example, a pseudo-random pattern generator (PRPG), and generates pseudo-random patterns as test patterns.

The pattern compressor 22 receives output data from the plurality of scan chains 25. The pattern compressor 22 compresses test results corresponding to a plurality of test patterns sequentially and cumulatively, and outputs a compression value. The pattern compressor 22 is a multiple input signature register (MISR), for example.

The clock control circuit 23 receives a clock CLK from an external device. The clock control circuit 23 generates an internal clock, and supplies the internal clock to the pattern generator 21, the logic circuit 20, and the pattern compressor 22.

The LBIST control circuit 24 controls a test operation of an entire core 11. The LBIST control circuit 24 executes a test (LBIST) for the logic circuit 20 based on a control signal CNT from the test controller 12.

(Structure of Scan Chains 25)

Next, a structure of the scan chains 25 will be described. FIG. 4 is a circuit diagram of a part of the scan chain 25.

The scan chain 25 includes a plurality of scan flip-flops 26. Each of the scan flip-flops 26 includes an input terminal D, an input terminal TI, a clock terminal CP, a test enable terminal TE, and an output terminal Q.

Normal data is input to the input terminal D from a logic circuit 27. Test data (a test pattern) is input to the input terminal TI. The input terminal TI is coupled to the output terminal Q of the scan flip-flop 26 of a previous stage. A clock CLK is input to the clock terminal CP. The output terminal Q outputs a state value of the scan flip-flop 26.

In a normal mode, the scan flip-flop 26 synchronizes to the clock CLK, selects and stores normal data from the input terminal D, and outputs a state value for itself to the output terminal Q. On the other hand, in a test mode, the flip-flop 26 synchronizes to a clock CLK, selects and stores test data from the input terminal TI, and outputs a state value for itself to the output terminal Q. In other words, the plurality of scan flip-flops 26 are coupled in series to each other in a test mode, and they sequentially transfer test data. Each scan flip-flop 26 inputs test data from a scan flip-flop 26 of the previous stage, and output test data to a scan flip-flop 26 of the next stage. Switching between the normal mode and the test mode (switching between normal data input and test data input) is made in accordance with a test enable signal TES.

FIG. 5 is a circuit diagram showing another structure of the scan flip-flop 26. The scan flip-flop 26 includes a selector 26A and a flip-flop 26B.

The input terminal D of the scan flip-flop 26 is coupled to a first input terminal of the selector 26A. The input terminal TI of the scan flip-flop 26 is coupled to a second input terminal of the selector 26A. The test enable terminal TE of the scan flip-flop 26 is coupled to the control terminal of the selector 26A. The selector 26A selects either one of the normal data input to the input terminal D and the test data input to the input terminal TI, in accordance with a test enable signal TES input to the test enable terminal TE.

The flip-flop 26B is provided with an input terminal D', a clock terminal CP, and an output terminal Q. The output terminal of the selector 26A is coupled to the input terminal D' of the flip-flop 26B. The clock terminal CP of the flip-flop 26B corresponds to the clock terminal of the scan flip-flop 26. The output terminal Q of the flip-flop 26B corresponds to the output terminal of the scan flip-flop 26. The flip-flop 26B synchronizes to a clock CLK input to the clock terminal CP, selects and stores data from the input terminal D', and outputs a state value for itself to the output terminal Q.

[1-1-2] Structure of Pattern Generator 21

Figure 6:
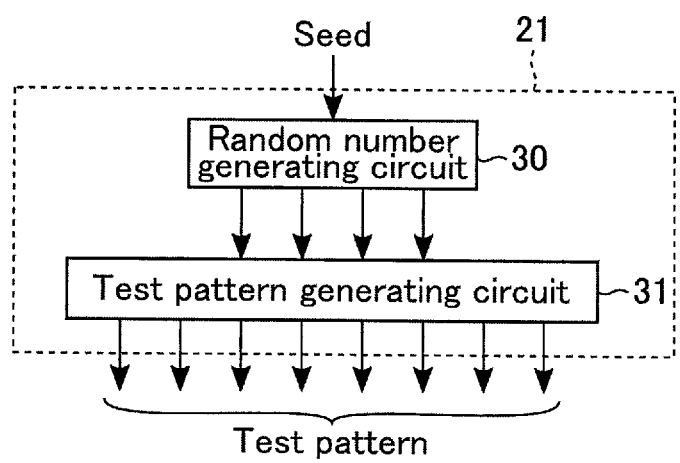
FIG. 6 is a block diagram of a pattern generator.

Next, a structure of the pattern generator 21 will be described. FIG. 6 is a block diagram showing the pattern generator 21. The pattern generator 21 is provided with a random number generating circuit 30 and a test pattern generating circuit 31.

The random number generating circuit 30 receives a seed (seed data) from the LBIST control circuit 24. The seed is an initial value for generating a random number. The random number generating circuit 30 generates a random number in accordance with the seed. The random number generating circuit 30 is comprised of a linear feedback shift register (LFSR), for example.

The test pattern generating circuit 31 uses the random number generated by the random number generating circuit 30 to generate a test pattern consisting of a predetermined number of bits. The test pattern generating circuit 31 is comprised of a decompressor that expands a data length of input data.

Figure 7:
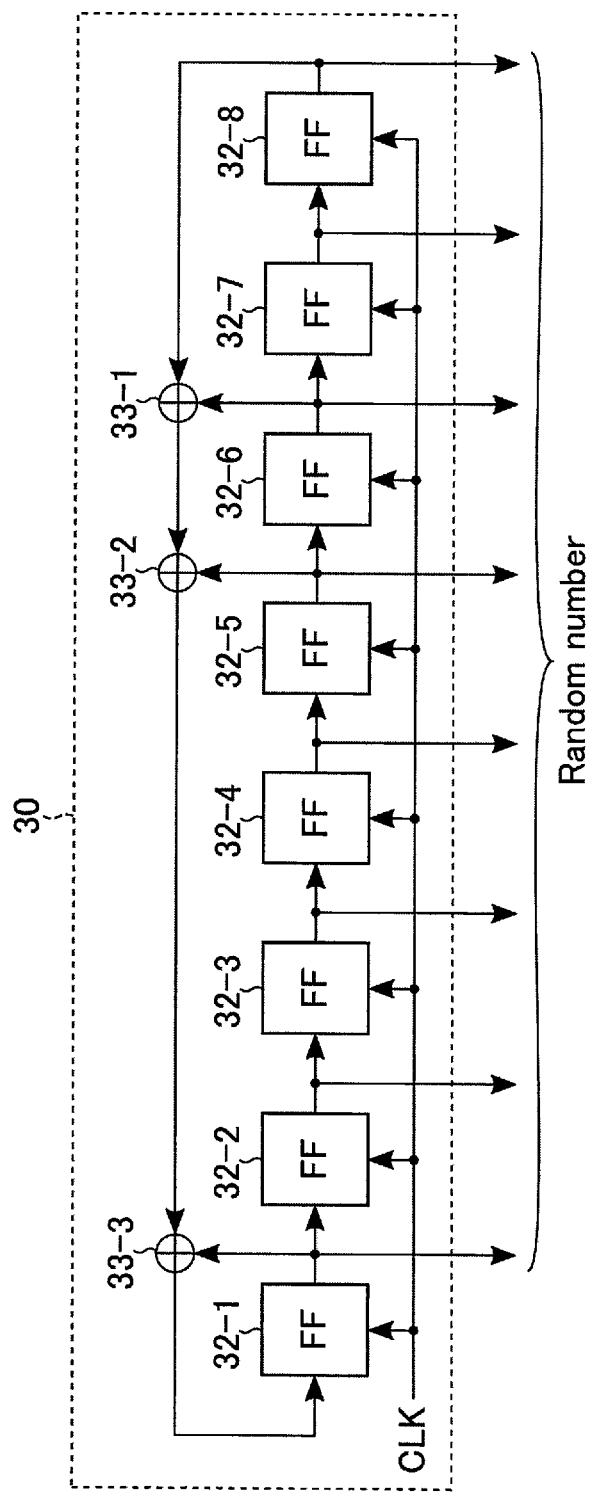
FIG. 7 is a circuit diagram explaining an example of a random number generating circuit.

FIG. 7 is a circuit diagram explaining an example of the random number generating circuit 30. FIG. 7 shows an example of a structure where an 8-bit random number is generated.

The random number generating circuit 30 has eight flip-flops 32-1 through 32-8, and three exclusive-or gates (referred to as "XOR gates" hereinafter) 33-1 through 33-3. The XOR gates 33-1 through 33-3 perform an exclusive-or operation.

The flip-flops 32-1 through 32-8 are cascaded in this order. The output terminal of the flip-flop 32-8 in the final stage is coupled to the input terminal of the flip-flop 32-1 in the first stage, via the XOR gates 33-1 through 33-3. A clock CLK is input to the flip-flops 32-1 through 32-8.

In particular locations between stages of the flip-flops 32-1 through 32-8, an XOR gate 33 is arranged. These particular locations are called "feedback points". FIG. 7 shows an example of a structure in which the random number generating circuit 30 has three XOR gates 33-1 through 33-3.

The first input terminal of the XOR gate 33-1 is coupled to the output terminal of the flip-flop 32-8, and the second input terminal of the XOR gate 33-1 is coupled to the output terminal of the flip-flop 32-6.

The first input terminal of the XOR gate 33-2 is coupled to the output terminal of the XOR gate 33-1, and the second input terminal of the XOR gate 33-2 is coupled to the output terminal of the flip-flop 32-5.

The first input terminal of the XOR gate 33-3 is coupled to the output terminal of the XOR gate 33-2, and the second input terminal of the XOR gate 33-3 is coupled to the output terminal of the flip-flop 32-1.

When the random-number generating circuit 30 structured in this manner is operated, first a seed is input to the flip-flops 32-1 through 32-8. The seed is a data sequence that is not an all-zero sequence. Then, every time a clock CLK is input, the output values of the flip-flop are shifted, and a random number is thereby generated. The random number is a collection of output data from the flip-flops 32-1 through 32-8.

If the aforementioned feedback point is set at a desired location between stages of the flip-flops, all possible pattern combinations (except for an all-zero sequence) taken by the output of the flip-flops can appear once in every predetermined cycle.

[1-1-3] Structure of Pattern Compressor 22

Next, a structure of the pattern compressor 22 will be described. FIG. 8 is a circuit diagram explaining an example of the pattern compressor 22. FIG. 8 shows a structure example where 8-bit output data is compressed.

The pattern compressor 22 is provided with eight flip-flops 34-1 through 34-8, and eight XOR gates 35-1 through 35-8.

The flip-flops 34-1 through 34-8 are cascaded with the XOR gates 35-1 through 35-8 being interposed therebetween. A clock CLK is input to the flip-flops 34-1 through 34-8.

Some of the XOR gates 35 (the XOR gates 35-2, 35-6, and 35-7 in the example of FIG. 8) operate as feedback points and perform an exclusive-or operation on corresponding data among the parallel output data from the scan chains, the output of the flip-flop of a previous stage, and the output of the flip-flop of the final stage, and input a result of the operation into the flip-flop of the next stage. The other XOR gates (the XOR gates 35-1, 35-3 through 35-5, and 35-8 in the example of FIG. 8) perform an exclusive-or operation on corresponding data among the parallel output data and the output of the flip-flop of a previous stage, and the gates input a result of the operation into the flip-flop of the next stage.

When data compression is performed, first the outputs of the flip-flops 34-1 through 34-8 are initialized to a predetermined value (normally, all zero), and then the pattern compressor 22 compresses the parallel output data from the scan chains as the pattern compressor 22 is synchronizing to a clock CLK and sequentially obtaining the parallel output data. The output of the flip-flops 34-1 through 34-8 at the time when input of all data is completed is a result of the compression (compression value). The output of the flip-flops 34-1 through 34-8 at the time when input of all data is completed is called a "signature".

[1-1-4] Structure of Test Controller 12

Next, a structure of the test controller 12 will be described. FIG. 9 is a block diagram of the test controller 12-1. The structure of the test controller 12-2 is the same as that of the test controller 12-1. The test controller 12-1 has a comparator 40 and a main control circuit 44.

The core used as reference is called a reference core. For example, of the cores 11A-1 through 11A-4, the core 11A-4 is a reference core. A core for which testing is performed is called a test-target core. For example, any one of the cores 11A-1 through 11A-3 may be a test-target core. Herein, the cores 11A-1 through 11A-3 are subsequently targeted for testing.

The main control circuit 44 obtains a test pattern from the reference core, and supplies the obtained test pattern to the test-target core. Then, the main control circuit 44 performs a test operation on the test-target core and the reference core.

The test controller 12-1 obtains compression values from the test-target core and the reference core. The obtained two compression values are sent to the comparator 40.

The comparator 40 compares the obtained two compression values. The comparator 40 has a selector (MUX) 41, an XOR gate 42, and a register (REG) 43.

The selector 41 receives compression values from the cores 11A-1 through 11A-4. The selector 41 selects the compression values of the test-target core and the reference core based on a select signal SEL1 supplied from the main control circuit 44.

The XOR gate 42 receives the two compression values from the selector 41. The XOR gate 42 performs an exclusive-or operation.

The register 43 stores an operation result of the XOR gate 42. The output (comparison result) of the register 43 is sent to the main control circuit 44.

The main control circuit 44 determines whether or not the test has been passed in accordance with the comparison result from the comparator 40. Then, the main control circuit 44 makes a majority determination using the test results of all the test-target cores, and specifies a defective core. The main control circuit 44 also generates a relief solution to replace the defective core with a relief core. The relief solution is output to an external device of the semiconductor integrated circuit 10, or is reported to an internal block having a relief algorithm. For example, if it is determined that a test has not been passed only for a result of the comparison of the reference core 11A-4 with the core 11A-3 among the comparisons of the reference core 11A-4 with the cores 11A-1 through 11A-3, it can be determined that the core 11A-3 is a defective core. The defective core relief may be achieved by replacing the defective core with the reference core.

[1-2] Operation

The operation of the semiconductor integrated circuit 10 structured as described above will be described. FIG. 10 is a flowchart explaining a test operation of the semiconductor integrated circuit 10.

As described above, the test controller 12-1 performs tests on the cores 11A-1 through 11A-4, and the test controller 12-2 performs tests on the cores 11B-1 through 11B-4. Hereinafter, the test operation of the test controller 12-1 and the cores 11A-1 through 11A-4 will be described in detail. The test operation of the test controller 12-2 and the cores 11B-1 through 11B-4 is the same as, and is performed in parallel with, the test operation of the test controller 12-1 and the cores 11A-1 through 11A-4.

Of the cores 11A-1 through 11A-4, the core 11A-4 is a reference core. The reference core 11A-4 keeps performing tests (namely, LBIST).

The main control circuit 44 determines a test-target core (step S100). For example, a test is performed on the core 11A-3. The core 11A-3 is a test-target core.

Subsequently, the main control circuit 44 obtains a test pattern that is set in the pattern generator 21 from the reference core 11A-4 (step S101). Specifically, in accordance with the control of the main control circuit 44, the LBIST control circuit 24 included in the reference core 11A-4 reads data (a seed) retained in the plurality of flip-flops 32 of the random number generating circuit 30, and supplies the read seed to the main control circuit 44. FIG. 11 is a schematic diagram explaining the test operation of the test-target core 11A-3 and the reference core 11A-4. As shown in FIG. 11, a seed for a test pattern is obtained from the reference core 11A-4.

Subsequently, the main control circuit 44 supplies the seed obtained in step S101 to the test-target core 11A-3 (step S102). As shown in FIG. 11, the seed is supplied to the test-target core 11A-3. The LBIST control circuit 24 included in the test-target core 11A-3 sets the seed for the plurality of flip-flops 32 of the random number generating circuit 30.

Subsequently, the main control circuit 44 performs a test operation for the same number of cycles on the test-target core 11A-3 and the reference core 11A-4 (step S103). FIG. 12 is a schematic diagram explaining the test operation of the test-target core 11A-3 and the reference core 11A-4. As shown in FIG. 12, a test operation is performed for the same number of cycles on the test-target core 11A-3 and the reference core 11A-4. One cycle corresponds to one cycle of the clock CLK (clock cycle). The pattern generator 21 generates a single test pattern per cycle. The pattern compressor 22 compresses data in each cycle, and outputs a compression value.

Subsequently, the test controller 12-1 obtains a compression value from each of the test-target core 11A-3 and the reference core 11A-4 (step S104). FIG. 13 is a schematic diagram explaining the test operation of the test-target core 11A-3 and the reference core 11A-4. As shown in FIG. 13, a compression value is obtained from each of the test-target core 11A-3 and the reference core 11A-4. As a method of obtaining the compression values, for example, a compression value is obtained from a single core per cycle, namely 1-bit data is obtained from each core. Alternatively, one multiple-bit data sequence may be obtained from each core in each cycle of a predetermined number of cycles.

Subsequently, the comparator 40 compares the compression value of the test-target core 11A-3 with the compression value of the reference core 11A-4 (step S105). The compression value of the reference core 11A-4 is used as an expected value.

Subsequently, the main control circuit 44 determines whether or not the test has been passed in accordance with the comparison result from the comparator 40 (step S106). If the compression value of the test-target core 11A-3 is the same as that of the reference core 11A-4, the main control circuit 44 determines that the test has been passed.

Subsequently, the main control circuit 44 determines whether or not testing for all the cores, namely the cores 11A-1 through 11A-3, is finished (step S107). If testing of all the cores has not been finished (No in step S107), the main control circuit 44 returns to step S100. Then, the test operation is performed using the reference core 11A-4.

If testing of all the cores has been finished (Yes in step S107), the main control circuit 44 makes a majority determination using the test results of the cores 11A-1 through 11A-3. Then, the main control circuit 44 determines a defective core by a majority determination (step S108).

The main control circuit 44 then generates a relief solution to replace the defective core with a relief core.

[1-3] Advantageous Effects of First Embodiment

In a semiconductor integrated circuit for which high reliability is requested, a field test is conducted on a client system side after product shipment, and LBIST is used as one of the field test methods. Generally, a parameter prepared in advance (including a seed and the number of cycles) is used to perform logic BIST for each core. However, there are failures that cannot be detected in LBIST using a prepared parameter, and a failure detection rate decreases as a consequence.

In the first embodiment, of the cores 11A-1 through 11A-4 having the same circuit structure, a certain core (for example, the core 11A-4) is used as a reference core dedicated to testing. The reference core 11A-4 continuously performs a plurality of tests. The reference core 11A-4 can sequentially generate an initial test pattern for the plurality of tests, and can change the initial test pattern for each test. Furthermore, the reference core 11A-4 can generate an expected value for determining a test result.

Thus, according to the first embodiment, a possibility that failures that cannot be detected by a fixed parameter can be detected increases. It is thus possible to realize a semiconductor integrated circuit 10 that can improve a failure detection rate.

It is determined whether or not a test has been passed by comparing test results (compression values) of a reference core and a test-target core. For this reason, there is no need to generate an expected value to determine a test result.

[2] Second Embodiment

In the second embodiment, a reference core dedicated to performing a test is not provided. A test pattern for each test is stored in a storage circuit in the second embodiment. In a next test, two cores are tested in the same number of cycles using a previous test pattern as an initial value.

[2-1] Structure of Test Controller 12

The overall structure of the semiconductor integrated circuit 10 is the same as that of the first embodiment as shown in FIG. 2.

Figure 14:
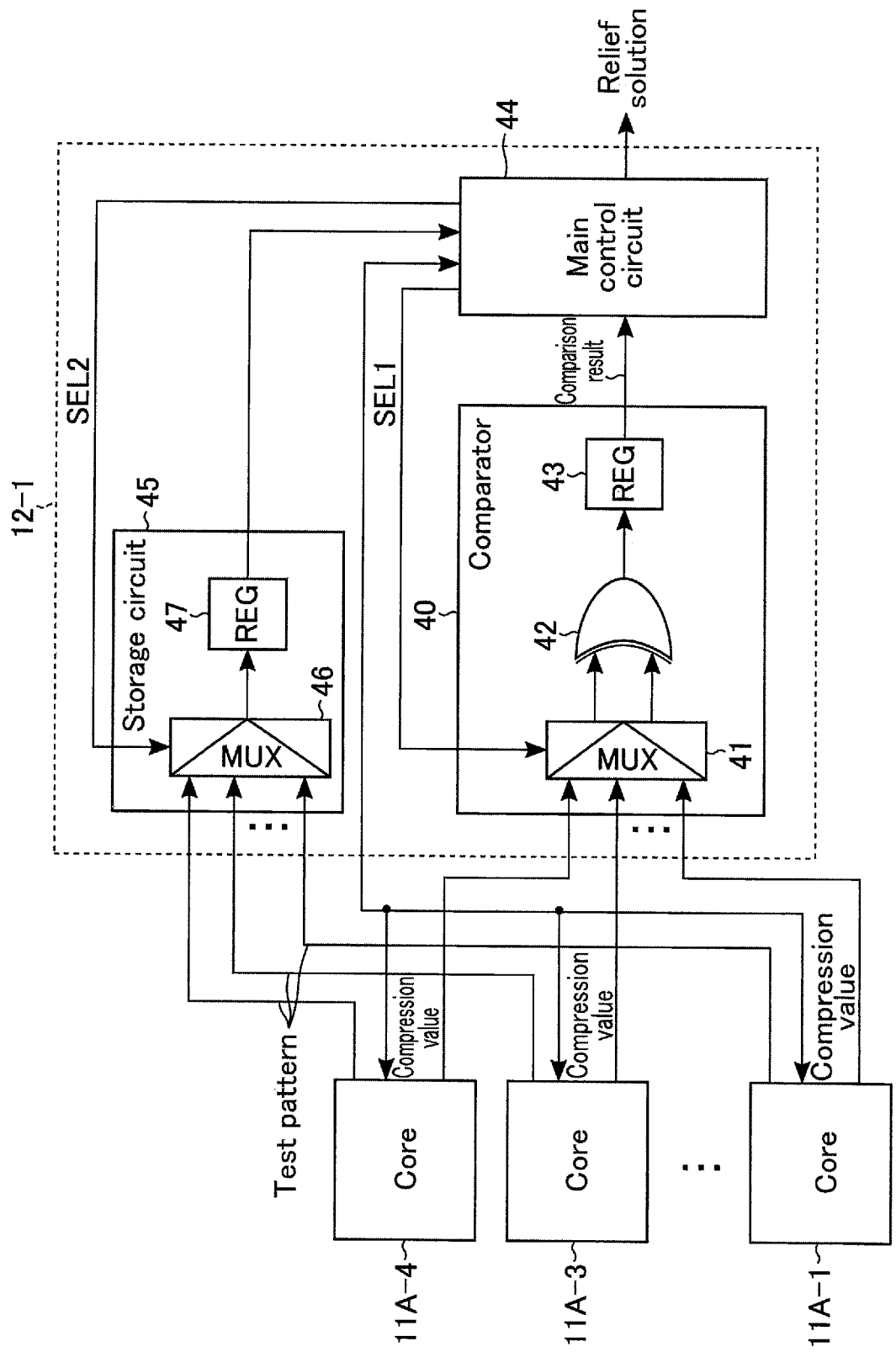
FIG. 14 is a block diagram of a test controller according to a second embodiment.

Hereinafter, a structure of the test controller 12 will be described. FIG. 14 is a block diagram of the test controller 12-1 according to the second embodiment. The structure of the test controller 12-2 is the same as that of the test controller 12-1.

The test controller 12-1 is provided with the storage circuit 45. The storage circuit 45 stores a parameter (seed) for a test pattern every time a test is finished. The storage circuit 45 has a selector 46 and a register 47.

The selector 46 receives the test patterns (specifically, seeds) from the cores 11A-1 through 11A-4. The selector 46 selects a test pattern based on a select signal SEL2 supplied from the main control circuit 44.

The register 47 stores the test pattern selected by the selector 46. The output of the register 47 is sent to the main control circuit 44.

The main control circuit 44 supplies the parameter stored in the storage circuit 45 to two test-target cores. Then, the main control circuit 44 performs a test operation on two test-target cores.

[2-2] Operation

Figure 15:
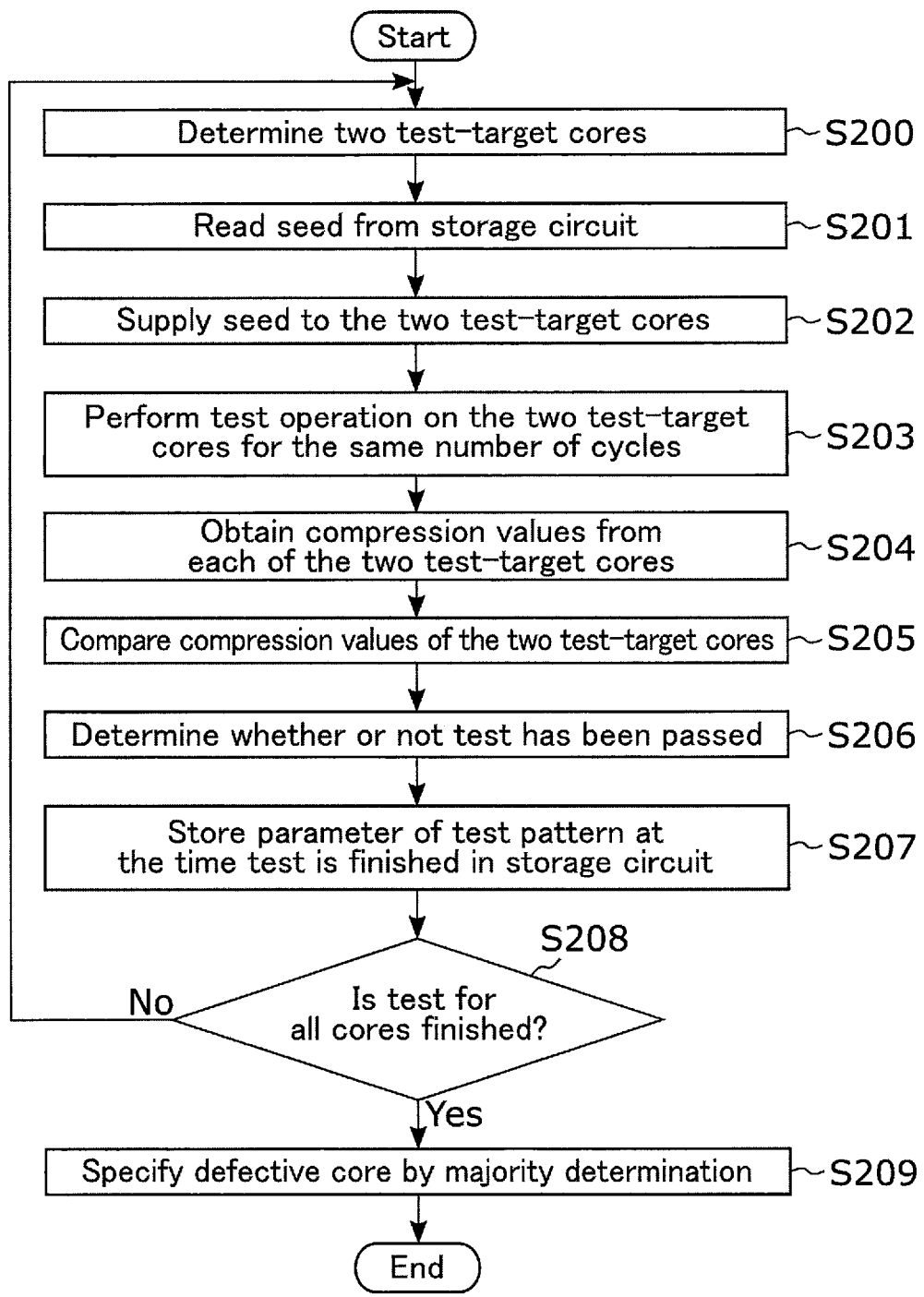
FIG. 15 is a flowchart explaining a test operation of the semiconductor integrated circuit according to the second embodiment.

The operation of the semiconductor integrated circuit 10 structured as described above will be described. FIG. 15 is a flowchart explaining a test operation of the semiconductor integrated circuit 10 according to the second embodiment. Assume the register 47 stores a seed for a test pattern at the time when a previous test is finished.

The main control circuit 44 determines two test-target cores (step S200). For example, the cores 11A-3 and 11A-4 are test-target cores.

Subsequently, the main control circuit 44 reads a seed for a test pattern from the storage circuit 45 (step S201).

Subsequently, the main control circuit 44 supplies the seed read in step S201 to the test-target cores 11A-3 and 11A-4 (step S202). FIG. 16 is a schematic diagram explaining the test operation of the test-target cores 11A-3 and 11A-4. As shown in FIG. 16, the seed is supplied to the test-target cores 11A-3 and 11A-4. The LBIST control circuit 24 included in each of the test-target cores 11A-3 and 11A-4 sets the seed for the plurality of flip-flops 32 of the random number generating circuit 30.

Subsequently, the main control circuit 44 performs a test operation for the same number of cycles on the test-target cores 11A-3 and 11A-4 (step S203). FIG. 17 is a schematic diagram explaining the test operation of the test-target cores 11A-3 and 11A-4. As shown in FIG. 17, a test operation is performed for the same number of cycles on the test-target cores 11A-3 and 11A-4.

Subsequently, the test controller 12-1 obtains a compression value from each of the test-target cores 11A-3 and 11A-4 (step S204). FIG. 18 is a schematic diagram explaining the test operation of the test-target cores 11A-3 and 11A-4. As shown in FIG. 18, a compression value is obtained from each of the test-target cores 11A-3 and 11A-4.

Subsequently, the comparator 40 compares the compression value of the test-target core 11A-3 with the compression value of the test-target core 11A-4 (step S205). Subsequently, the main control circuit 44 determines whether or not the test has been passed in accordance with the comparison result from the comparator (step S206). If the compression value of the test-target core 11A-3 is the same as that of the reference core 11A-4, the main control circuit 44 determines that the test has been passed.

Subsequently, the main control circuit 44 stores, in the storage circuit 45, a parameter of a test pattern at the time when the test in the test-target core 11A-3 is finished (step S207). Specifically, the main control circuit 44 obtains the seed of the test pattern at the time when the test is finished (the data stored in eight flip-flops 32-1 through 32-8 of the random number generating circuit 30) from the test-target core 11A-3, and stores the obtained seed in the storage circuit 45.

Subsequently, the main control circuit 44 determines whether or not testing for all the cores, namely the cores 11A-1 through 11A-4, is finished (step S208). If testing of all the cores has not been finished (No in step S208), the main control circuit 44 returns to step S200.

If testing of all the cores has been finished (Yes in step S208), the main control circuit 44 makes a majority determination using the test results of the cores 11A-1 through 11A-4. The main control circuit 44 determines a defective core by a majority determination (step S209).

Thereafter, the main control circuit 44 also generates a relief solution to replace the defective core with a relief core.

[2-3] Advantageous Effects of Second Embodiment

According to the second embodiment, it is possible to perform continuous operation of LBIST without setting a reference core. It is also possible to perform a test operation using a parameter other than a predetermined parameter. It is thus possible to realize a semiconductor integrated circuit 10 that can improve a failure detection rate. The other advantages of the second embodiment are the same as those of the first embodiment.

[3] Modifications

The reference core continuously operates during a plurality of tests. Thus, deterioration of cores may be predicted by confirming a state of the reference core. It may be possible to predict deterioration of cores by comparing a state of the continuously operating reference core with a state of other cores.

When a core used as a system fails, a reference core may be used as relief.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor integrated circuit comprising:
a first core that includes a first logic circuit that has a plurality of scan chains, and a first generator that generates a first test pattern for the scan chains of the first logic circuit;

a second core that includes a second logic circuit that has a plurality of scan chains, and a second generator that generates a second test pattern for the scan chains of the second logic circuit;
a controller that controls a test operation of the first and second cores, wherein
the controller is configured to:
obtain a seed for a test pattern from the first generator;
supply the obtained seed to the second generator such that the second generator generates the second test pattern by using the obtained seed;
perform a test on the first and second cores for a same number of test cycles;
obtain first and second test results respectively from the first and second cores; and
compare the first test result with the second test result to determine whether the first test result is the same as the second test result.

2. The semiconductor integrated circuit according to claim 1, wherein
the first core includes a first control circuit that inputs the first test pattern to the scan chains of the first logic circuit and performs a test for each test cycle, and
the second core includes a second control circuit that inputs the second test pattern to the scan chains of the second logic circuit and performs a test for each test cycle.

3. The semiconductor integrated circuit according to claim 1, wherein
the first core includes a first compressor that compresses data output from the scan chains of the first logic circuit and outputs the first test result, and
the second core includes a second compressor that compresses data output from the scan chains of the second logic circuit and outputs the second test result.

4. The semiconductor integrated circuit according to claim 3, wherein
each of the first and second compressors includes a plurality of exclusive-or gates and a plurality of flip-flops, the exclusive-or gates and the flip-flops being alternately cascaded, and
data output from the scan chain is input to input terminals of the plurality of exclusive-or gates.

5. The semiconductor integrated circuit according to claim 1, wherein
the controller includes a comparator that compares the first and second test results for each test cycle.

6. The semiconductor integrated circuit according to claim 5, wherein
the comparator includes a register that stores a comparison result.

7. The semiconductor integrated circuit according to claim 1, wherein
the first generator includes a first random number generating circuit that generates a random number, and a first test pattern generating circuit that generates the first test pattern by using the random number generated by the first random number generating circuit, and
the second generator includes a second random number generating circuit that generates a random number, and a second test pattern generating circuit that generates the second test pattern using the random number generated by the second random number generating circuit.

8. The semiconductor integrated circuit according to claim 7, wherein
each of the first and second random number generating circuits includes a plurality of cascaded flip-flops.

9. The semiconductor integrated circuit according to claim 1, wherein
the first core is a reference core, and
the second core is a test-target core.

10. The semiconductor integrated circuit according to claim 9, wherein
the test-target core determined to be defective as a result of testing is relieved through a use of the reference core.

11. A semiconductor integrated circuit comprising:
a first core that includes a first logic circuit that has a plurality of scan chains, and a first generator that generates a first test pattern for the scan chains of the first logic circuit;
a second core that includes a second logic circuit that has a plurality of scan chains, and a second generator that generates a second test pattern for the scan chains of the second logic circuit;
a storage circuit that stores a seed for a test pattern at a time when a previous test is finished; and
a controller that controls a test operation of the first and second core tests, wherein
the controller is configured to:
read the seed from the storage circuit;
supply the read seed to the first and second generators such that the first and second generators generate the first and second test patterns by using the obtained seed;
perform a test on the first and second cores for a same number of test cycles;
obtain first and second test results respectively from the first and second cores; and
compare the first test result with the second test result to determine whether the first test result is the same as the second test result.

12. The semiconductor integrated circuit according to claim 11, wherein
the first core includes a first control circuit that inputs the first test pattern to the scan chains of the first logic circuit and performs a test for each test cycle, and
the second core includes a second control circuit that inputs the second test pattern to the scan chains of the second logic circuit and performs a test for each test cycle.

13. The semiconductor integrated circuit according to claim 11, wherein
the first core includes a first compressor that compresses data output from the scan chains of the first logic circuit and outputs the first test result, and
the second core includes a second compressor that compresses data output from the scan chains of the second logic circuit and outputs the second test result.

14. The semiconductor integrated circuit according to claim 13, wherein
each of the first and second compressors includes a plurality of exclusive-or gates and a plurality of flip-flops, the exclusive-or gates and the flip-flops being alternately cascaded,
the data output from the scan chain is input to input terminals of the plurality of exclusive-or gates.

15. The semiconductor integrated circuit according to claim 11, wherein
the controller includes a comparator that compares the first and second test results for each test cycle.

16. The semiconductor integrated circuit according to claim 15, wherein the comparator includes a register that stores a comparison result.

17. The semiconductor integrated circuit according to claim 11, wherein
the first generator includes a first random number generating circuit that generates a random number, and a first test pattern generating circuit that generates the first test pattern by using the random number generated by the first random number generating circuit, and
the second generator includes a second random number generating circuit that generates a random number, and a second test pattern generating circuit that generates the second test pattern by using the random number generated by the second random number generating circuit.

18. The semiconductor integrated circuit according to claim 17, wherein
each of the first and second random number generating circuits includes a plurality of cascaded flip-flops.

19. A method of testing a semiconductor integrated circuit, wherein
the semiconductor integrated circuit comprises:
a first core that includes a first logic circuit that has a plurality of scan chains, and a first generator that generates a first test pattern for the scan chains of the first logic circuit;
a second core that includes a second logic circuit that has a plurality of scan chains, and a second generator that generates a second test pattern for the scan chains of the second logic circuit;
the test method comprises:
obtaining a seed for a test pattern from the first generator;
supplying the obtained seed to the second generator such that the second generator generates the second test pattern by using the obtained seed;
performing a test on the first and second cores for a same number of test cycles;
obtaining first and second test results respectively from the first and second cores; and
comparing the first test result with the second test result to determine whether the first test result is the same as the second test result.

* * * * *